United States Patent [19]

Hayashi et al.

[11] 3,950,738
[45] Apr. 13, 1976

[54] SEMI-CONDUCTOR NON-VOLATILE OPTICAL MEMORY DEVICE

[75] Inventors: Yutaka Hayashi, Houya; Kiyoko Nagai, Chofu; Yasuo Tarui, Higashi-Kurume, all of Japan

[73] Assignee: Agency of Industrial Science & Technology, Tokyo, Japan

[22] Filed: July 12, 1974

[21] Appl. No.: 487,963

[30] Foreign Application Priority Data

July 13, 1973 Japan.............................. 48-78410

[52] U.S. Cl.......... 340/173 LS; 340/173 R; 357/13; 357/19; 357/23; 357/30
[51] Int. Cl.².......................................... G11C 11/42
[58] Field of Search ................... 357/23, 30, 19, 13; 340/173 R, 173 LS

[56] References Cited
UNITED STATES PATENTS

| | | | |
|---|---|---|---|
| 2,820,841 | 1/1958 | Carlson et al.......................... | 357/30 |
| 3,229,104 | 1/1966 | Rutz......................................... | 357/19 |
| 3,641,512 | 2/1972 | Bentchkowsky................. | 340/173 R |
| 3,789,369 | 1/1974 | Lile et al................................ | 357/23 |
| 3,832,732 | 8/1974 | Roberts................................... | 357/19 |

OTHER PUBLICATIONS

Agusta et al., Nonvolatile Imaging Devices, IBM Technical Disclosure Bulletin, Vol. 15, No. 9, 2/73, p. 2821.
Laibowitz et al., Four-Terminal Field-Effect Device, IBM Technical Disclosure Bulletin, Vol. 13, No. 12, 5/71, pp. 3791-3792.
Terman, Floating Avalanche–Injection Metal–Oxide Semiconductor Device with Low–Write Voltage, IBM Technical Disclosure Bulletin, Vol. 14, No. 12, 5/72, p. 3721.

*Primary Examiner*—Stuart N. Hecker
*Attorney, Agent, or Firm*—Oblon, Fisher, Spivak, McClelland & Maier

[57] ABSTRACT

A semiconductor non-volatile optical memory device is constructed by providing light-permeable charge retention means in an insulating layer on a first semiconductor surface into which photo-generated carriers in the surface of the first semiconductor region are injected over the semiconductor-insulator potential barrier by applying reverse bias between the first semiconductor region and a second region forming a rectifying junction with the first semiconductor region. Also disclosed in a non-volatile memory integrated circuit employing one or more of said devices together with light source in the same package. The non-volatile memory integrated circuit operates under low bias voltage and is compatible with a high speed integrated logic circuits.

19 Claims, 16 Drawing Figures

SEMI-CONDUCTOR NON-VOLATILE OPTICAL MEMORY DEVICE

BACKGROUND OF THE INVENTION

This invention relates to a semiconductor non-volatile optical memory device for visible and infrared light input and to an integrated circuit comprising one or more said semiconductor devices.

There are known many semiconductor optical devices such as photo-diodes, photo-transistors and photo-conductive devices. Furthermore, image detectors such as photo-diode arrays and CCDs have recently been developed. But the electrical output of these devices relative to optical information is volatile.

The object of this invention is to provide a semiconductor device or integrated circuit which non-violatilely memorizes optical information and is capable of electrical readout.

The other object of this invention is to provide an integrated non-volatile memory circuit with low operating voltage which is compatible with high speed integrated logic circuits.

SUMMARY OF THE INVENTION

A semiconductor non-volatile optical memory device constructed for the purpose of achieving the above described objects of the present invention comprises a semiconductor substrate having a first semiconductor region and a second region, an insulating layer provided on a surface of the first semiconductor region and second region including a junction between the first and second regions and a light-permeable charge retention means provided in the insulating layer; the said second region being provided in or on the surface of the first semiconductor region and beneath the charge retention means, and said junction being a rectifying junction such as P-N junction, hetero-junction or Schottky barrier. The present semiconductor device may further comprise a gate electrode on the insulating layer as an auxiliary electrode and may comprise a third region, which is provided in or on the first semiconductor region beneath the charge retention means or the charge retention means and the auxiliary electrode and provides a rectifying junction with the first region also. In the latter case, it is possible to read out optical information as change in charge induced in the surface of the first semiconductor region, change in capacitance between the first semiconductor region and the second region or between the second region and the gate electrode or between the gate electrode and the first region, or change in threshold voltage of an FET formed with the first semiconductor region, the second region, the third region, the insulating layer having the charge retention means such as a floating gate or a floating gate and a gate electrode provided on the insulating layer, or change in electric current between the second and third regions.

In a write-in mode of optical information according to the present invention, irradiation of light (including ultra-violet, visible and infra-red regions) produces carriers in the surface of the first semiconductor region and the photo-generated carriers are accelerated by a high electric field in the surface of the first region produced by a reverse bias between the first region and the second region and penetrating into the insulating layer containing the charge retention means, so that the carriers are injected into the insulating layer and retained in the charge retention means provided in the insulating layer.

In this case, it is sufficient, by theory, to provide a higher potential (or energy) to the carriers than the barrier potential between the first semiconductor region and the insulating layer at a point as near as possible to the surface of the first semiconductor region. For example, in a case where the first semi-conductor region is of Si and the insulating layer is of $SiO_2$, the potential is selected so as to be higher than their barrier potentials (3–4 eV) and the voltage to be applied to the rectifying junction and is lower than the avalanche breakdown voltage of the rectifying junction. Further, in case of the carriers being excited by visible light, since their energy at the time point that they are generated is higher than the energy level of the conduction band, the carriers can be injected with a lower energy than that in the aforementioned case. The voltage required by the auxiliary gate electrode provided on the insulating layer is also low in the value.

The carrier charges retained in the charge retention means may be discharged by stimulating them by irradiation of the charge retention means with a high energy ray such as X-ray, or neutralized or inverted in the polarity by injecting the opposite charged carriers, which are generated by the surface avalanche breakdown of the rectifying junction provided below the insulating layer.

When a memory array is constituted with the devices of the present invention, the selection of address may be performed by a bias applied to the rectifying junction or the gate provided above the insulating layer of the device.

These and other objects and features of the present invention will be described in detail with respect to the attached drawings.

DETAILED EXPLANATION OF THE INVENTION

Figure 1A:
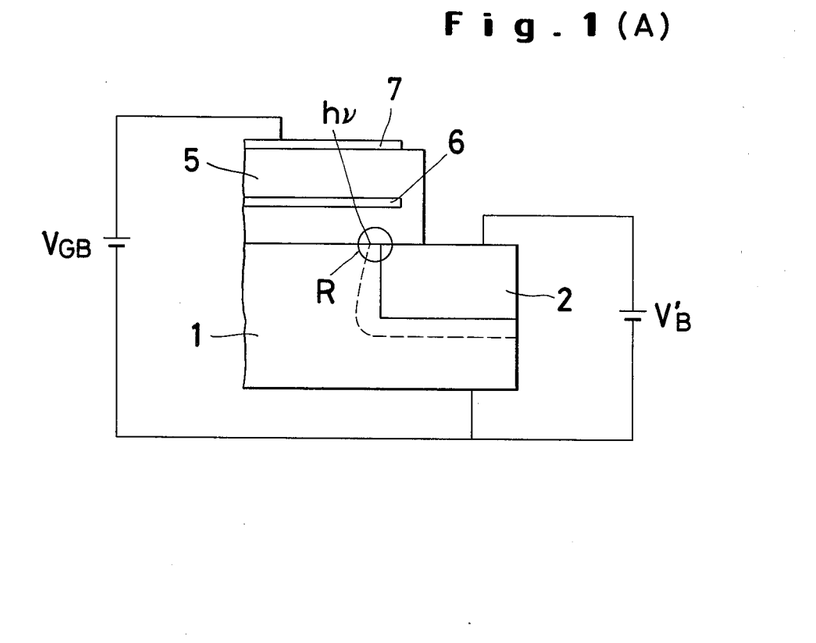
FIGS. 1A, B and C are embodiments of the non-volatile optical memory device of the present invention.
Figure 1B:
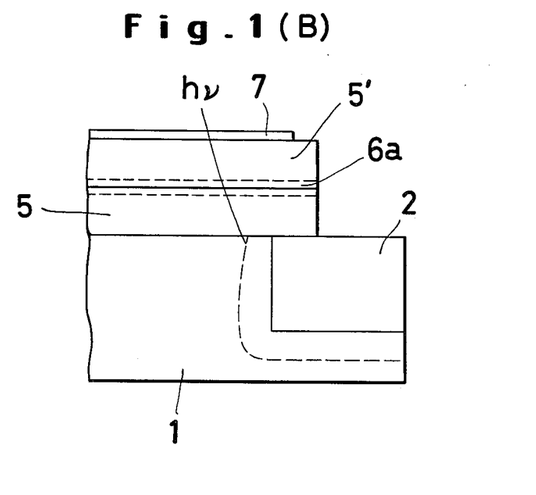
Figure 1C:
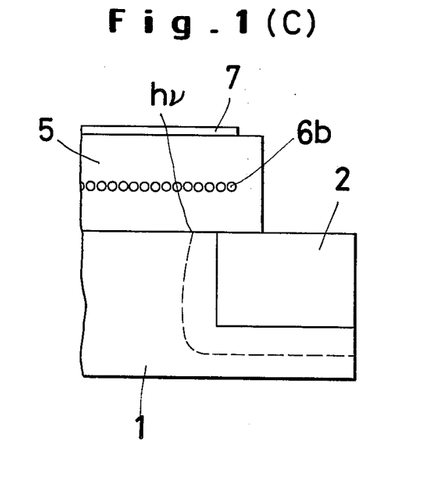

FIGS. 1A, 1B and 1C show non-volatile semiconductor optical memory devices according to the present invention, respectively.

Referring to FIG. 1A, the memory device is composed of a semiconductor region 1 and a second region 2 which forms, together with the region 1, a rectifying junction, and an insulating layer 5 is provided over the regions such that at least a portion of the junction area of the regions 1 and 2 is covered by the insulating layer 5. Within the insulating layer 5, an electrically conductive light-permeable charge retention means 6 such as floating gate is embedded and a light permeable auxiliary electrode 7 is provided on the insulating layer. Between the regions 1 and 2 there is applied a reverse bias volate $V_B'$, which is lower than this breakdown voltage of the rectifying junction and higher than the barrier potential $E_B/q$ between the semiconductor and the insulating layer.

In the memory device shown in 1B 1 two kinds of insulating layers 5 and 5' are provided on the regions such that the layers cover the region 1 and at least a portion of the region 2, and a charge retention means 6a is formed between the two insulating layers 5 and 5' as trap centers for charged carriers. Further, a light permeable electrode 7 is also auxiliarily provided on the insulating layer 5'. The charge retention means 6a of FIG. 1B functions in the same way as the floating gate 6 of FIG. 1A. In FIG. 1A, although the conductive gate is shown as electrically continuous, the charge retention means can be realized by isolated small particles of conductive material 6b, as shown in FIG. 1C. Accordingly, the memory device in FIGS. 1B and 1C operates in a similar manner to the embodiment in FIG. 1A, the operation of which will be described hereinafter.

Although the semiconductor region 1 is shown in FIGS. 1A ~ 1C as a substrate, it is possible to provide a isolated semiconductor region having the same function as that of the region 1 in a substrate or on a substrate.

Figure 2:
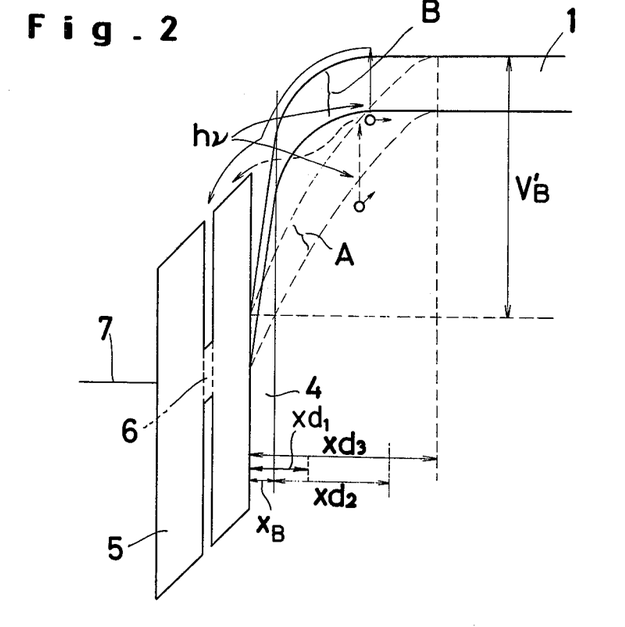
FIG. 2 is an illustration showing the energy band diagrams when a reverse bias voltage is applied to the rectifying junction between the first and the second region of the present non-volatile optical memory device with the auxiliary electrode bias.

Now, it is assumed that a bias voltage $V_B'$ is applied between the region 1 and region 2 as shown in FIG. 2. In this case, an electric field due to the voltage $V_B'$ affects the insulating layer 5, gate 6 and the auxiliary gate electrode 7, resulting in an energy band diagram in the region 1 as defined by dotted lines A in FIG. 2. That is, it is possible to create a high electric field region "R" as shown in FIG. 1A in the surface of the semiconductor region 1 by the application of the reverse bias voltage $V_B'$. When a depletion layer of the region R is irradiated by a light passed through the layer 5, photo-excited charges are generated, and those of the charges which are carrier charges of the same conductivity type as those of the region 1 and have high energy level, will pass over the energy barrier $E_B$ between the insulating layer and the semiconductor region 1 and reach the floating gate 6 which constitutes the charge retention means. In this manner, the information given by the light can be stored. In the operation of this case, the auxiliary gate electrode 7 provided on the insulating layer 5 is not an essential constructive requirement.

The storage of optical signal information using injection of carrier charges of the opposite conduction type to that of the region 1 is possible by applying the voltage to the electrode 7 in FIGS. 1A ~ 1C. That is, where the reverse bias $V_B'$ is applied between the regions 1 and 2, the voltage $V_{th}$ to be applied to the electrode 7 which is sufficient to make the surface of the semiconductor region 1 into a deplete or to invert is given by the following equation (1), $$\left| V_{th} \right| ** 1/C_{ox} \sqrt{2qN_B\epsilon_{se}} \sqrt{[V_B' + \phi_F]} + |V_B' + \phi_F| \quad (1)$$

where $N_B$ is the impurity density of the region 1, $\phi_F$ is Fermi potential of the same region 1, $\epsilon_{se}$ is the dielectric constant of the semiconductor region 1 and $C_{ox}$ is the capacitance between the electrode 7 and the region 1.

In a case where the reverse bias voltage $V_B'$ is selected to be the same as or higher than $E_B$ and lower than the avalanche breakdown voltage between the regions 1 and 2 and a voltage $V_{GB}$ which is higher than $V_{th}$ in the equation (1) is applied to the electrode 7, when a light irradiates the surface of the region 1 through the floating gate 6 (charge retention means), electrode 7, and the insulating layer 5, the surface is inverted and the electric field in the region 1 becomes high due to the application of the reverse voltage $V_B'$ as shown by the lines A in FIG. 2. As a result, carrier charges of the same polarity as that of the carrier charges in the inverted layer of the region 1, that is, charges of the opposite conductivity type of the region 1 are injected into the conductive floating gate 6 constituting the charge retention means and information corresponding to the irradiating light signal is stored therein. In this case, however, where charges of the same polarity as that of the region 1 are stored in the charge retention means, voltage $V_{GB}$ will be lowered depending upon the amount of the stored charge, so that, even if the electrode 7 is absent, carriers of the opposite conduction type can be injected. For example, where the charge retention means is a conductive gate embedded in the insulating layer as shown in FIG. 1A, the electrode 7 will be unnecessary because a large amount of carrier charges of the same conductivity type as that of the region 1 can be injected by the avalanche breakdown between the regions 1 and 2. This consideration can also be applied for the subsequent embodiments which will be described hereinafter.

Figure 3:
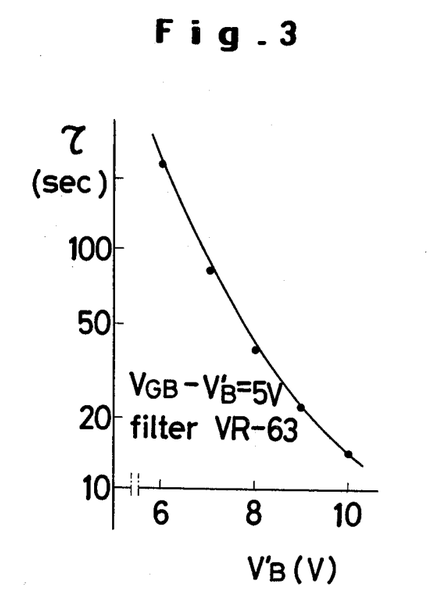
FIG. 3 is a graph showing time constant $\tau$ versus the auxiliary electrode bias $V_{GB}$ of photo-generated carrier injection into a charge retention means of the present non-volatile optical memory device when a light ray having more length of longer than 6300 A long wavelength is used as input light source.
Figure 4:
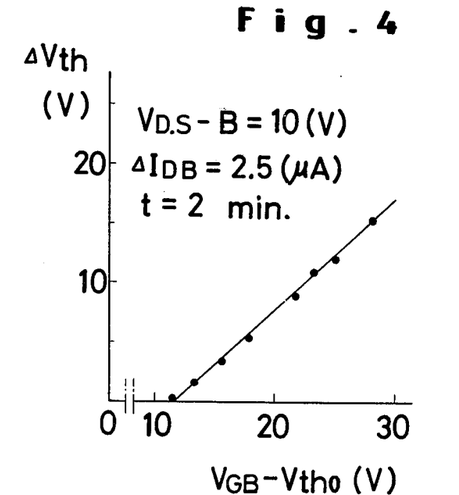
FIG. 4 is a graph showing the characteristics of the shift in threshold voltage $\Delta V_{th}$ versus the reverse bias voltage $V_B'$ by carrier injection performed in accordance with the present invention under the same input light source with in FIG. 3 to the embodiment shown in FIG. 1.

FIG. 4 shows the result of measurement of injection characteristics of carriers of the opposite conductivity type to that of the region 1 under illumination of a tungsten lamp through a optical filter VR-63 as the threshold voltage shift $V_{th}$ of a channel induced in the surface of the region 1 under $V_B'$ of 0 volt, that is, as the threshold voltage shift measured at the auxiliary gate electrode 7 due to the carrier charges injected into the charge retention means provided in the insulating layer. In this experiment, wave length of the illuminating light is longer than 6300 A. FIG. 3 shows the carrier injecting time constant of the floating gate 6 with the same light input signal having wave length longer than 6300 A, that is, having low energy, through a filter VR-63. This carrier injecting time constant is proportional to the incident light intensity. The carrier charge injected into the charge retention means is proportional to the light intensity under constant exposure time. Thus, non-volatile memorization of a light signal is possible and can be electrically read out as change in electrical quantity such as capacitance, minority carrier charge and the threshold voltage shift described above. In this measurement, the region 1 was of a 1Ω-cm P-type silicon material, the region 2 was of a low resistive n+ silicon material, the insulating layer 5 was of $SiO_2$ and the charge retention means 6 was transparent polycrystalline silicon having thickness less than 3000 A and embedded in the $SiO_2$ layer. Further, in this measurement, the electrode 7 was constructed with a thin alluminum film having a portion which has an opening above the charge retention means 6.

That is, it is sufficient for light to have only small enough energy to generate carriers in the semiconductor surface and, therefore, even infrared light can be used, provided that the energy thereof is higher than the band gap $E_G$ of the semiconductor (e.g., for Si substrate, 1.1 eV) and not necessarily higher than the barrier energy $E_B$ between the region 1 and the insulating layer. Further, since the injection is performed in the whole surface portion of the region 1 below the floating gate 6, the amount of injection can be increased.

Figure 5:
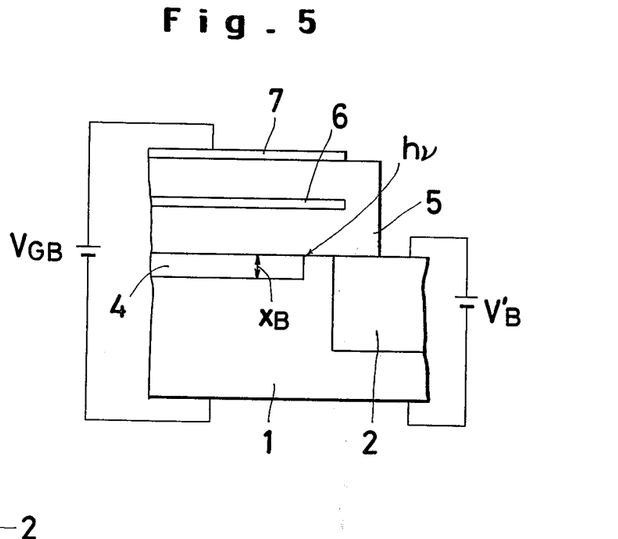
FIGS. 5 to 8 are other embodiments of the present non-volatile optical memory devices.

FIG. 5 is a second embodiment of the present invention for explaining a method of improving the injection efficiency, i.e., decreasing the injection time constant.

In the embodiment shown in FIG. 5, the provision of the third region 4 in a portion of the surface of the semiconductor region 1 is the essential feature. The region 4 is of the same conductivity type as that of the region 1 and the impurity concentration therein is higher than that in the region 1.

Under application of the reverse bias voltage $V_B'$ as in the case of the embodiment in FIG. 1, that is, when the voltage applied between the second region 2 and first region 1 is selected as higher than the aforementioned energy barrier $E_B$ and further a voltage higher than $V_{th}$ given by the equation (1) using the impurity concentration of the region 4 as $N_B$ is applied to the electrode 7, an invertion layer is induced in the surface of the region 4. Therefore, when the depletion layer in the region 4 is irradiated by light through permeable layers such as the insulating layer 5 and gate 6, carrier injection thereto can be performed as in the first embodiment shown in FIG. 2. Further, in this case, since the impurity concentration of the region 4 is larger than that of 1, the electric field in the semiconductor surface is strengthened as shown by solid lines "B" in FIG. 2 and thus injection of carrier charges of the opposite conductivity type to that of the region 4 can be efficiently performed. That is, since the carrier injection efficiency is represented by an exponential function of surface electric field intensity at the surface region 4 ranging from the surface of the semiconductor region 4 to a portion of the semiconductor region 4 at which the semiconductor potential reaches the barrier potential between the semiconductor and the insulating layer, the larger field intensity provides much ligher injection efficiency and since the injection is performed over the whole surface of the region 4, the amount of injection is increased.

A detailed description of this phenomenon follows:

For example, assuming that $X_{d1}$ is the depletion layer thickness in the surface of the region 4 in a case where the region 4 is formed sufficiently thick and the thickness or depth $X_B$ of the region 4 is selected to be shorter than the width $X_{d1}$ as shown in FIG. 2, the surface depletion layer in the region 4 becomes extended into the region 1 with width $X_{d2}$ and thus $(X_B+X_{d2})$ becomes shorter than the depletion layer width $X_{d3}$ of a uniform base formed of only the semiconductor region 1 but longer than $X_{d1}$. On the other hand, the electric field may be concentrated into the high impurity concentration region 4 and further lower value of $V_{GB}$ is sufficient to high injection efficiency. In this manner, since the amount of generated carriers by light irradiation depends upon the depletion layer width $X_{d2}$, by making $X_B<X_{d1}$, the generation coefficient thereof can be made larger than that in the case where the depletion layer is expanded in only the uniformly high impurity concentration region, and, further, for the injection efficiency to the insulating layer, the highly efficient injection due to the high impurity concentration region 4 can be utilized.

In another embodiment in which the region 4 is formed by selective diffusion of P type impurity of boron into the surface of the P type high resistive region 1, an injection efficiency 100,000 times higher than that of the embodiment shown in FIG. 3 was obtained. The materials and dimensions of the remaining portions of the last embodiment are the same as those of the embodiment shown in FIG. 3 and the surface concentration of impurity in the region 4 is $5 \times 10^{17} cm^{-3}$. The injection time constant of carrier becomes 1/100,000 with respect to the device shown in FIG. 3 and the write-in time of the optical information is on the order of milliseconds.

Accordingly, it becomes possible to efficiently use the light in the visible range and even in the infrared region as input signal.

Figure 6:
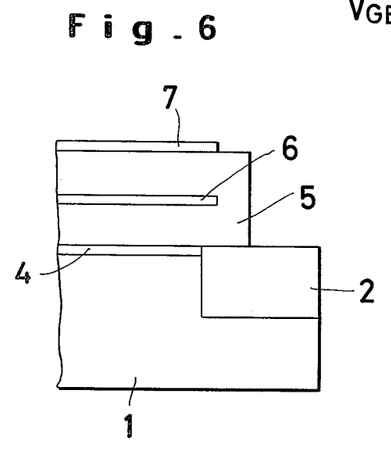

FIG. 6 is a modification of the embodiment shown in FIG. 5, in which the region 4 is provided in contact with the side wall of the region 2. For carriers of the opposite conductivity type to that of the region 1, it is possible to obtain the same result as that obtained by the embodiment of FIG. 5. Further, for carriers of the same conductivity type as that of the region 1, it is possible as shown by the energy band diagram B in FIG. 2, to make the injection rate higher because of the strengthened electric field of the region R shown in FIG. 1A.

Figure 7:
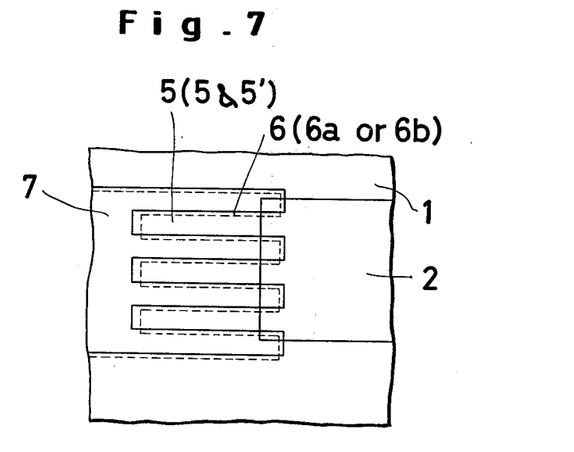

The floating gate 6 charge retention means 6a, 6b and auxiliary gate electrode 7 of the respective elements shown in FIGS. 1A ~ 1C may, instead of being made with transparent material, be constructed as an electrode made of an opaque material. In such case, it is convenient to shape the electrode as a slit configuration by removing at least a portion thereof covering an area between the regions 1 and 2. This electrode configuration is shown in FIG. 7. In this specification, all of these electrodes such as of transparent material or of a slit configuration are referred to as light-permeable electrodes.

Figure 8:
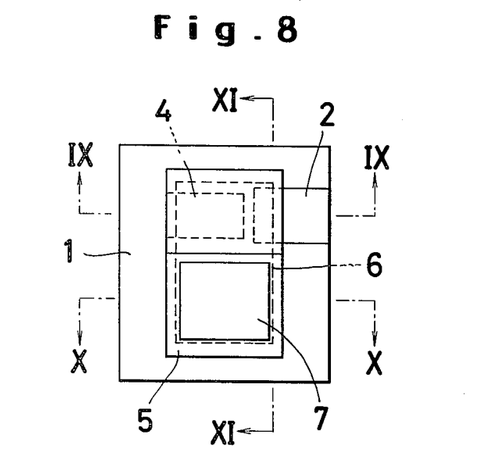
Figure 9:
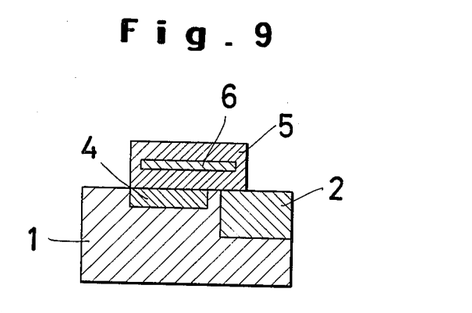
FIGS. 9 to 11 are cross sections taken along various lines in FIG. 8, respectively.
Figure 10:
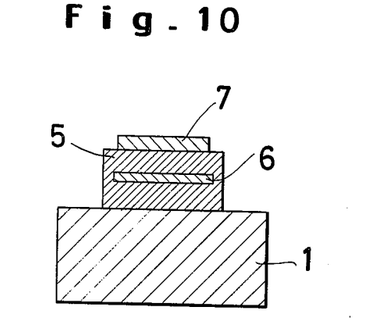
Figure 11:
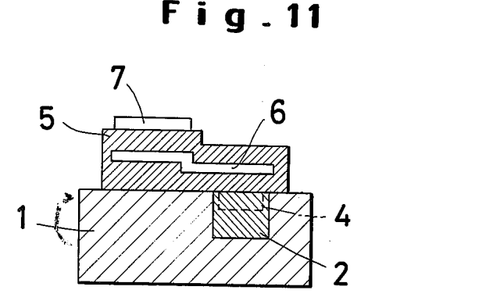

FIG. 8 shows, in plane view, a fourth embodiment of the present invention, in which a portion of the electrode 7 is removed so as to make it possible to control the electric potential of the light-permeable floating gate 6 by an electric potential of the electrode 7 and to pass a light through a portion of the gate 6 into the region 4. FIGS. 9–11 are cross sections taken along lines IX—IX, X—X and XI—XI of FIG. 8, respectively. In this construction, it is possible to minimize the light energy loss due to the upper side electrode or electrodes. Although in this embodiment, the region 4 is not in contact with the region 2, it is also possible to employ a construction wherein these regions are in contact with each other.

Although the elements shown in FIGS. 1A ~ 1C and 5–8 have rectifying junctions constituted with the region 1 and region 2, respectively, the detection of information is commonly performed by utilizing the fact that the capacitance between the region 1 and region 2 or between the electrode 7 and the region 1 or 2 to the voltage $V_B'$ varies with the carriers injected into the charge retention means 6, 6a or 6b. Further, since carriers having opposite polarity to that of the charges retained in the charge retention means are induced in the surface of the semiconductor region 1 or 4 under the charge retention means, it is possible to detect information by detecting those carriers having the opposite polarity.

Figure 12:
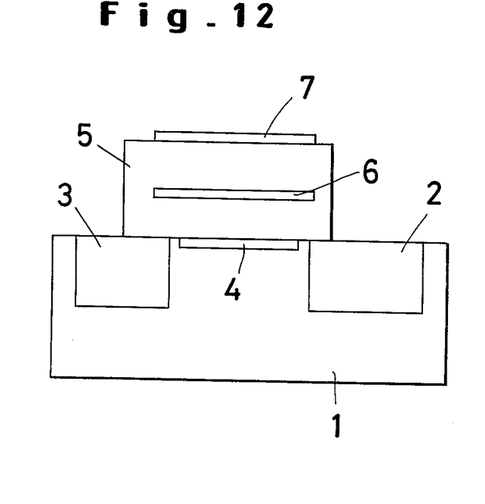
FIG. 12 is another embodiment of the present non-volatile optical memory device having an FET construction with an additional region.

FIG. 12 is a modification of the embodiment in FIG. 1A ~ 1C, 5, 6, 7 or 8, in which another region 3 of the same material or of a semiconductor material having the same conductivity type as that of the second region 2 is provided in the semiconductor region 1 as shown, so that a so-called FET is constituted. In this figure, the region 4 is also shown. So long as the region 3 is beneath the edge of the charge retention means 6, it may be either on the opposite side or the same side of the region 2 with respect to the region 4. One of the examples is shown in FIG. 12. Of course, this construction can be formed on the basis of the respective embodiments previously described.

In this device, the writing-in of information by the injection of carriers of the same conductivity type as that of region 1 or the opposite to that of the region 1 into the charge retention means, and erasing of the information or rewriting of the same are performed in the same manner as in the elements shown in FIG. 6–8. With this embodiment, it is possible to expand the high electric field region R by connecting the region 3 with the region 2 and applying a reverse bias $V_B'$ thereto and thus to improve the injection efficiency.

The detection of information is performed by the previously mentioned methods which utilize the capacitance variation or the variation of channel condition of the FET, that is, the conduction state between the regions 2 and 3.

In the structure of the present invention, when a pulsed or high frequency electric field is applied to the electrode 7, a voltage other than the D.C. voltage is induced in the semiconductor region 1 and region 4 and the electric field is strengthened due to the presence of the region 4 as shown B in FIG. 2, resulting in an efficient carrier injection without the second region 2.

In the embodiments described hereinbefore, Si is used as the semiconductor material. However, in view of fabrication, when III-V compound is used as the semiconductor material, it may be desirable to select the material used to form the region 2 so as to form between semiconductor 1 and region 2 a hetero junction or Schottky junction rather than a PN junction.

Devices due to the present invention are used to memorize a light information non-violatilely and an array comprising the present device is used to memorize a light pattern information non-volatilely. The informations can be electrically read out and can be erasable.

Applications of the present device to an externally electrically controllable non-volatile memory device with low voltage operation compatible with conventional logic circuits will be described hereinafter. It is obtained by packing a light irradiation means and a chip containing the present device or devices and the logic circuits. There will now be described an embodiment of a hermetically sealed memory circuit employing as one device or devices thereof a device having the construction of one of the devices described hereinbefore.

Figure 13:
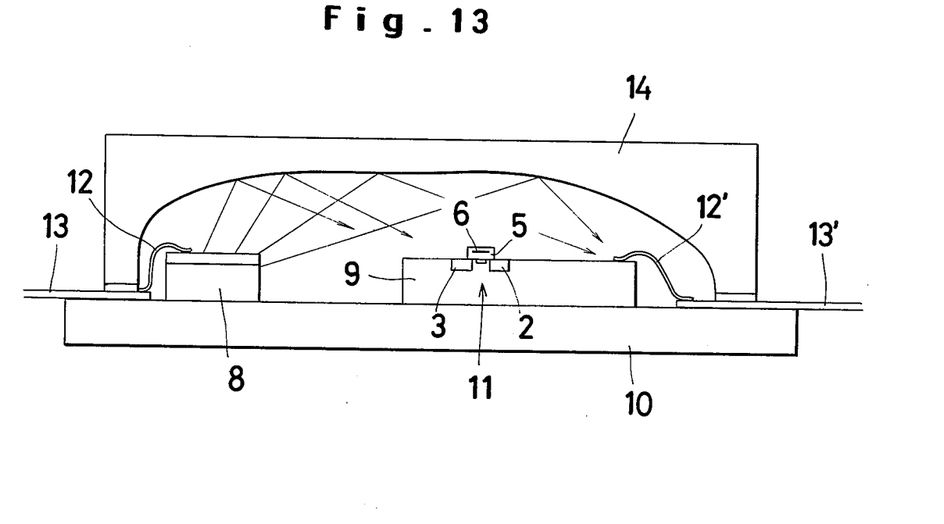
FIG. 13 is an embodiment of a semiconductor integrated circuit provided with the present non-volatile optical memory device or devices as well as an light irradiation means.

Referring FIG. 13, a hermetrically sealed container for an integrated circuit comprises a bottom plate 10 and a cover 14. On the bottom plate 10, are disposed a semiconductor integrated circuit including a light-emitting diode or a laser diode 8 and a single or plural non-volatile optical memory device 11 according to the present invention. In this arrangement, a memory device 11 have a drain 3 and a source 2 in the substrate 9 and a light-permeable floating gate 6 is provided in an insulating layer 5 of the device.

The supply of voltage to the light-emitting diode 8 is made through metal wire 13 connected to the diode 8 through fine wire 12. And the operation of the device is controlled through lead wires, one being shown as 13' connected to the device 11 through metal wires 12'. In the actual structure, plural number of lead wires are electrically connected to the diode and the device, but in the figure only one pair of lead wires are shown as a representative.

In write-in or rewrite operation, the light-emitting diode 8 produces light upon application of electric current thereto, and the emitted light is reflected by the inner wall of the cover 14 of the container and illuminates all of the surface of the semiconductor chip 11. Accordingly, by suitable designing the shape of the inner wall of the cover 14 using conventional techniques, it is possible to control the reflected ray so as to illuminate the whole surface of the chip 11 uniformly or illuminate only a local portion thereof. Further, it is possible to improve the reflection by vapor-depositing metallic material on the inner wall of the cover 14. The light-emitting diode and the container constitute a light irradiation means.

In case of a diode having a large photo-emissive plane or a memory device having a small area, it is possible to use direct light from the diode for excitation. Therefore, in this case, it is possible to attach the diode directly onto the inner wall of the cover 14 so that the diode is positioned in facing relation to the surface of the semiconductor chip 11. In this case, the light-emitting diode and means for arranging the diode in such relation to the semiconductor chip constitutes the light irradiation means.

Figure 14:
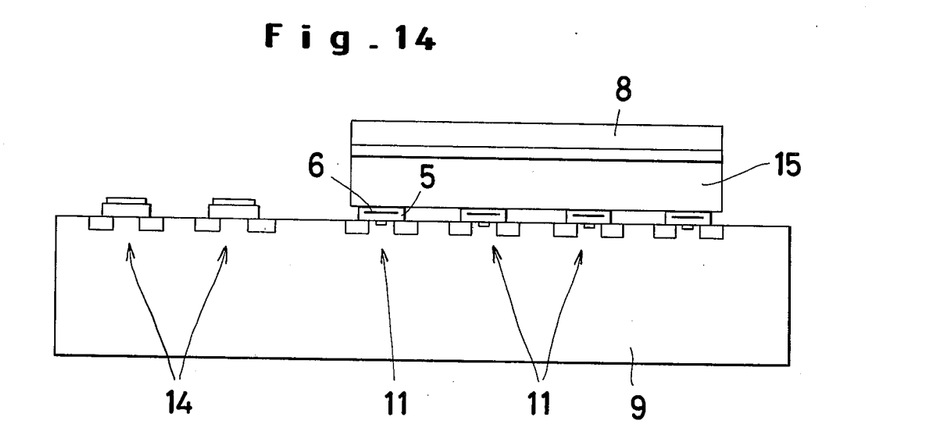
FIG. 14 is another embodiment of combination of a light irradiation means and a semiconductor integrated circuit provided with a plurality of the present non-volatile semiconductor optical memory devices, and logic circuits.

It is also possible to attach the light irradiation means onto the semiconductor chip 11 via the insulating layer 15, as shown in FIG. 14.

The photo-emissive element as a light irradiation means in this invention is not limited to such a light-emitting diode. A laser diode or light emitting or laser diode array can be used as such element and the charge retention means of the memory element is not defined as one having a floating gate but may be one of the plural insulating layer type or of isolated conductive particle type as shown in FIGS. 1B and 1C. Further, the number of the rectifying junctions provided below the charge retention means may be one. The number of the memory device integrated in the semiconductor chip is not limited to one and the thousands of devices can be integrated.

The above mentioned modifications of the various components of the present device falls within the scope of the present invention.

Further, it is possible to obtain an integrated circuit containing logic circuits and non-volatile memory devices with low voltage operation compatible with the conventional logic circuit by integrating, in or on a common substrate 9, a number of the present memory devices 11 and logic circuits 14, as shown in FIG. 14.

Since, in the present invention, the high energy carriers are generated not by electric field excitation but photo-excitation, it is possible to lower the operation voltage and to integrate the non-volatile memory device together with the conventional circuits. As a result, the fabrication thereof is facilitated, so that a semiconductor integrated circuit including reliable non-volatile memory device is provided.

What is claimed is:

1. A semiconductor non-volatile optical memory device for visible and infrared light comprising,
   a first semiconductor region,
   a second region forming a rectifying junction with the surface of said first semiconductor region,
   an insulating layer provided on said two regions,
   light-permeable charge retention means provided in said insulating layer on said two regions for retaining carriers generated by light-irradiation on said first semiconductor region and a means for applying reverse bias voltage smaller than breakdown voltage of said rectifying junction to said rectifying junction.

2. A semiconductor non-volatile optical memory device as set forth in claim 1, wherein said charge retention means provided in said insulating layer is of light-transparent conductive material.

3. A semiconductor non-volatile optical memory device as set forth in claim 1, wherein said charge retention means provided in said insulating layer is opaque and has over said rectifying junction a slit through which light is permitted to pass.

4. A semiconductor non-volatile optical memory device as set forth in claim 1, wherein said insulating layer comprises two kinds of insulating layers and said charge retention means provided in said insulating layer is carrier traps produced at the interface between the two kinds of insulating layers.

5. A semiconductor non-volatile optical memory device as set forth in claim 1, further comprising a third region provided in the surface of said first semiconductor region and under the charge retention means, said third region being disposed apart from or in contact with the side wall of said second region and being of the same conductivity type as that of said first semiconductor region and the impurity concentration in said third region being higher than that in said first semiconductor region.

6. A semiconductor non-volatile optical memory device as set forth in claim 1, further comprising a gate electrode provided on said insulating layer.

7. A semiconductor non-volatile optical memory device as set forth in claim 6, wherein said gate electrode is light-transparent.

8. A semiconductor non-volatile optical memory device as set forth in claim 6, wherein said gate elctrode is opaque and has a slit through which light is permitted to pass.

9. A semiconductor non-volatile optical memory device as set forth in claim 6, wherein said gate electrode is positioned above said charge retention means.

10. A semiconductor non-volatile optical memory device as set forth in claim 6, wherein said gate electrode is positioned above said charge retention means but not covered said rectifying junction under said charge retention means.

11. A semiconductor non-volatile optical memory device as set forth in claim 1, wherein said charge retention means provided in said insulating layer is constituted of isolated small particles of conductive material.

12. A semiconductor non-volatile optical memory device as set forth in claim 11, wherein said isolated small particles of conductive material are opaque.

13. A semiconductor non-volatile optical memory device as set forth in claim 1, further comprising another second region provided in or on said first semiconductor region at a distance from said second region and making another rectifying junction with the surface of said first semiconductor region, said insulating layer being provided on said two rectifying junctions.

14. A semiconductor non-volatile optical memory device as set forth in claim 13, further comprising a third region provided in the surface of said first semiconductor region and under the charge retention means.

15. A semiconductor non-volatile optical memory device as set forth in claim 14, wherein said third region is provided between said two second regions.

16. A semiconductor non-volatile optical memory device as set forth in claim 1, further comprising a third region of the same conductivity type as that of said first semiconductor region but of a different impurity concentration provided in the surface of said first semiconductor region and under the charge retention means.

17. A semiconductor non-volatile optical memory device as set forth in claim 16, wherein the depth of said third region is shorter than the width of the surface depletion layer formed in said third region and said first region by applying a reverse bias less than the breakdown voltage between said second region and said first region.

18. A semiconductor non-volatile optical memory device as set forth in claim 16, wherein the impurity concentration in the third region is higher than that in said first semiconductor region.

19. A semiconductor integrated circuit comprising:
   at least one semiconductor element having an insulating layer on the surface of the semiconductor thereof, a light-permeable charge retention means provided within said insulating layer and a rectifying junction provided beneath said charge retention means on the surface of said semiconductor,
   means for applying reverse bias voltage smaller than break-down voltage of said rectifying junction to said rectifying junction, and
   light irradiation means for generating carriers in said semiconductor element, said light irradiation means and said semiconductor element being disposed in one package,
   thereby generating carriers upon irradiation by light to give rise to an electric field including said charge retention means and injecting carrier charges into said charge retention means to memorize optical information non-volatilely.

* * * * *